(12) United States Patent
Allibert et al.

(10) Patent No.: US 9,129,800 B2
(45) Date of Patent: Sep. 8, 2015

(54) MANUFACTURING METHOD FOR A SEMICONDUCTOR ON INSULATOR TYPE SUBSTRATE FOR RADIOFREQUENCY APPLICATIONS

(75) Inventors: Frédéric Allibert, Grenoble (FR); Julie Widiez, Grenoble (FR)

(73) Assignees: Soitec, Bernin (FR); Commissariat A L'Energie Atomique et aux Energies Alternatives, Paris (FR)

( * ) Notice: Subject to any disclaimer, the term of this patent is extended or adjusted under 35 U.S.C. 154(b) by 3 days.

(21) Appl. No.: 14/006,378

(22) PCT Filed: Mar. 22, 2012

(86) PCT No.: PCT/EP2012/055133
§ 371 (c)(1),
(2), (4) Date: Dec. 2, 2013

(87) PCT Pub. No.: WO2012/127006
PCT Pub. Date: Sep. 27, 2012

(65) Prior Publication Data
US 2014/0084290 A1    Mar. 27, 2014

(30) Foreign Application Priority Data

Mar. 22, 2011   (FR) ..................... 11 52355

(51) Int. Cl.
*H01L 29/04*    (2006.01)
*H01L 29/06*    (2006.01)
(Continued)

(52) U.S. Cl.
CPC .... *H01L 21/02381* (2013.01); *H01L 21/02052* (2013.01); *H01L 21/76254* (2013.01); *H01L 29/04* (2013.01); *H01L 29/06* (2013.01)

(58) Field of Classification Search
CPC .... H01L 21/02381; H01L 29/04; H01L 29/06
USPC .................. 257/49, 273, 275–277, 506, 539; 438/479, 45, 455, 458, 478
See application file for complete search history.

(56) References Cited

U.S. PATENT DOCUMENTS 3,700,976 A * 10/1972 Dill ................................ 257/66
5,559,349 A *  9/1996 Cricchi et al. ................ 257/273
(Continued)

FOREIGN PATENT DOCUMENTS

CN   1679159 A   10/2005
EP   1780794 A1   5/2007
(Continued)

OTHER PUBLICATIONS

Jordan et al, "Semi-Insulating Silicon for Microware Devices", Solid-State Phenomena, vols. 156-158 (2010) pp. 101-106.
(Continued)

*Primary Examiner* — Sheng Zhu
(74) *Attorney, Agent, or Firm* — TraskBritt (57) ABSTRACT

The invention relates to a method for manufacturing a semiconductor on insulator type substrate for radio frequency applications, comprising the following steps in sequence: (a) provision of a silicon substrate with an electrical resistivity of more than 500 Ohm.cm, (b) formation of a polycrystalline silicon layer on the substrate, the method comprising a step between steps a) and b) to form a dielectric material layer, different from a native oxide layer, on the substrate, between 0.5 and 10 nm thick.

5 Claims, 6 Drawing Sheets

(51) Int. Cl.
*H01L 21/02* (2006.01)
*H01L 21/762* (2006.01)

(56) References Cited

U.S. PATENT DOCUMENTS

| | | | |
|---|---|---|---|
| 6,548,382 | B1 | 4/2003 | Henley et al. |
| 2004/0002197 | A1 | 1/2004 | Fathimulla et al. |
| 2005/0112845 | A1 | 5/2005 | Ghyselen et al. |
| 2007/0032040 | A1* | 2/2007 | Lederer .......................... 438/455 |
| 2008/0200010 | A1* | 8/2008 | Endo et al. .................... 438/458 |
| 2009/0321873 | A1* | 12/2009 | Nguyen et al. ................ 257/506 |
| 2009/0325364 | A1 | 12/2009 | Sasagawa et al. |
| 2010/0178750 | A1 | 7/2010 | Murakami et al. |

FOREIGN PATENT DOCUMENTS

| | | |
|---|---|---|
| FR | 2838865 A1 | 10/2003 |
| WO | 2010002515 A2 | 1/2010 |

OTHER PUBLICATIONS

French Preliminary Search Report for French Application No. 1152355 dated May 25, 2011, 2 pages.

Kerr et al., "Identification of RF Harmonic Distortion on Si Substrates and its Reduction Using a Trap-Rich Layer", 978-1-4244-856-5/08, IEEE 2008 IEEE.

Kwan, Kermit S., Chapter 4 of the dissertation, The Role of Penetrant Structure on the Transport and Mechanical Properties of a Thermoset Adhesive, Virginia Polytechnic Institute and State University, 1998.

Lederer et al., "Enhanced High Resistivity SOI Wafers for RF Applications ," IEEE Intl. SOI Conf., pp. 46-47, 2004.

Lederer et al, "New Substrate Passivation Method Dedicated to High Resistivity SOI Wafer Fabrication with Increased Substrate Resistivity." IEEE Electron Device Letters, vol. 26 N° 11, pp. 805-807, 2005.

Lederer et al, "RF Performance of a Commercial SOI Technology Transferred onto a Passivated HR Silicon Substrate", IEEE Transactions on Electron Devices, vol. 55, N° 7, pp. 1664-1671, 2008.

International Preliminary Report on Patentability for International Application No. PCT/EP2012/055133 dated Sep. 24, 2013, 6 pages.

International Written Opinion for International Application No. PCT/EP2012/055133 dated May 16, 2012, 5 pages.

International Search Report for International Application No. PCT/EP2012/055133 dated May 16, 2012, 3 pages.

Chinese Office Action Serial No. 2014111901344480 dated Nov. 24, 2014.

* cited by examiner

MANUFACTURING METHOD FOR A SEMICONDUCTOR ON INSULATOR TYPE SUBSTRATE FOR RADIOFREQUENCY APPLICATIONS

CROSS-REFERENCE TO RELATED APPLICATIONS

This application is a national phase entry under 35 U.S.C. §371 of International Patent Application PCT/EP2012/055133, filed Mar. 22, 2012, designating the United States of America and published in English as International Patent Publication WO 2012/127006 A1 on Sep. 27, 2012, which claims the benefit under Article 8 of the Patent Cooperation Treaty and under 35 U.S.C. §119(e) to France Application Serial No. 1152355, filed Mar. 22, 2011.

DOMAIN OF THE INVENTION

This invention relates to a method for manufacturing a semiconductor on insulator type substrate for radiofrequency applications and a substrate obtained using the method.

BACKGROUND OF THE INVENTION

There are different types of substrates for making radiofrequency (RF) devices at the present time.

A first type of substrate includes substrates comprising a silicon layer on an insulating substrate, for example such as Silicon on Quartz (SOQ), Silicon on Sapphire (SOS) or Silicon on Glass (SOG) substrates.

These substrates give excellent radiofrequency performances but have very poor characteristics concerning logical devices, due to the lower quality of the silicon. They are also very expensive.

A second type of substrate is a High Resistivity (HR) bulk Silicon substrate. « High Resistivity» Means Especially an Electrical Resistivity of More than 500 Ohm.cm.

Performances of these substrates are lower than the performances of the first substrates, and the logical devices do not benefit from the advantages of SOI type structures, although they do have the advantage of not being expensive.

A third type of substrate is a High Resistivity Silicon on Insulator (HR-SOI) substrate, in other words composed of a silicon layer on a high resistivity silicon substrate, a thick oxide layer being buried at the interface. This is why this oxide layer is usually referred to as BOX (« Buried OXide» ).

Such substrates are particularly advantageous for the functioning of logical devices, but their radiofrequency performances are not as good as SOQ and SOS substrates.

These substrates have the disadvantage that they sometimes include a low resistivity layer under the oxide layer.

For the purposes of this text, a « low resistivity», means electrical resistivity less than 500 Ohm.cm.

The presence of this low resistivity layer may be due to surface contamination of the substrates (for example due to condensation of boron and/or phosphorus) before bonding. These contaminants are then encapsulated at the bonding interface, and can diffuse into the high sensitivity substrate.

Another cause of the formation of the low resistivity layer occurs when the initial substrate is a silicon substrate with a high density of interstitial oxygen atoms; a heat treatment is then necessary to make the oxygen precipitate and obtain the required high resistivity. However, oxygen atoms can diffuse in the substrate before or during this treatment, which leads to the formation of regions in the substrate with a low precipitation rate—and therefore low resistivity—, particularly close to the surface of the substrate.

These two causes are difficult to control at the moment.

A fourth type of substrate consists of an HR-SOI type substrate in which the HR substrate is improved by the addition of traps.

Different techniques have been developed for this purpose but they have the disadvantage that they are very sensitive to heat treatments used to manufacture the SOI and then devices on the SOI.

Thus, a layer of polycrystalline silicon can be deposited between the oxide layer (BOX) and the HR substrate.

Further information on this subject can be found in publications written by D. Lederer, R. Lobet and J.-P. Raskin, "Enhanced high resistivity SOI wafers for RF applications," IEEE Intl. SOI Conf., pp. 46-47, 2004; D. Lederer and J.-P. Raskin, "New substrate passivation method dedicated to high resistivity SOI wafer fabrication with increased substrate resistivity," IEEE Electron Device Letters, vol. 26, no. 11, pp. 805-807, 2005; D. Lederer and J.-P. Raskin, "RF performance of a commercial SOI technology transferred onto a passivated HR silicon substrate", IEEE Transactions on Electron Devices, vol. 55, no. 7, pp. 1664-1671, 2008; and D. C. Kerr and al., "Identification of RF harmonic distortion on Si substrates and its reduction using a trap-rich layer", 978-1-4244-1856-5/08, IEEE 2008 IEEE.

Figure 1:
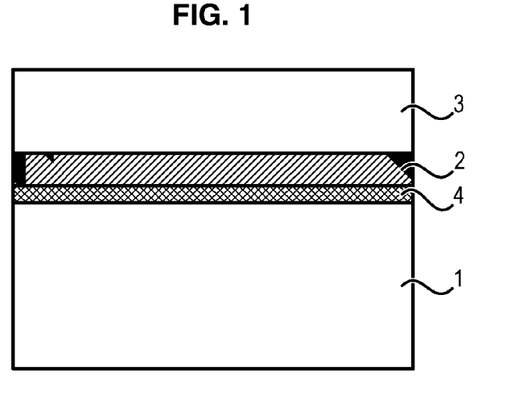
FIG. 1 is a diagram of a known HR-SOI type substrate.

FIG. 1 shows such a substrate that comprises an HR silicon substrate 1, followed successively by a polycrystalline silicon layer 4, an oxide layer 2 and a monocrystalline silicon layer 3 that forms the active layer of the substrate.

However, the polycrystalline silicon recrystallizes at high temperature, and doping agents present at the interface between the polycrystalline silicon layer and the HR silicon substrate diffuse in the HR silicon substrate, which has the effect of reducing its resistivity.

Figure 2:
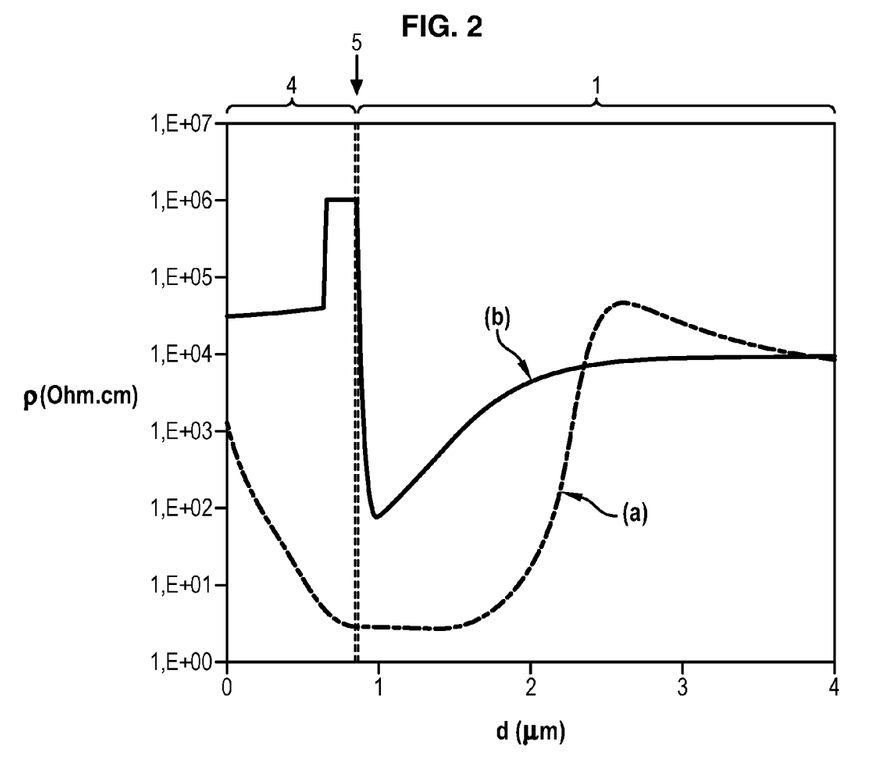
FIG. 2 is a graph showing the variation in electrical resistivity as a function of the depth in the substrate, for a substrate according to prior art (a) and a substrate conforming with the invention (b)

Curve (a) in the graph in FIG. 2 (shown in dashed lines) illustrates the variation in the electrical resistivity ρ of substrate 1 in FIG. 1 covered by the polycrystalline silicon layer 4 as a function of the depth d after heat treatment at 1100° C. for 6 hours, simulating the thermal budget for production of the HR-SOI substrate.

Therefore, on this graph the abscissa d=0 corresponds to the upper surface of the polycrystalline silicon layer, in other words the interface between the BOX 2 and the polycrystalline silicon layer 4.

Resistivity is measured using the Spreading Resistance Profiling (SRP) method.

As can be seen on curve (a), the resistivity reduces very quickly in layer 4 to reach a minimum level that extends into substrate 1, beyond the interface between the polycrystalline silicon and the HR silicon.

Beyond a depth of the order of 2 μm under the BOX, the resistivity of the substrate 1 quickly increases to reach high resistivity values.

The drop in resistivity observed on this curve can be explained by recrystallization of polycrystalline silicon during the above-mentioned heat treatment and/or by diffusion of the doping agents at the interface between the layer 4 of polycrystalline silicon and the substrate 1, or even contamination of the upper surface of layer 4.

Figure 5:
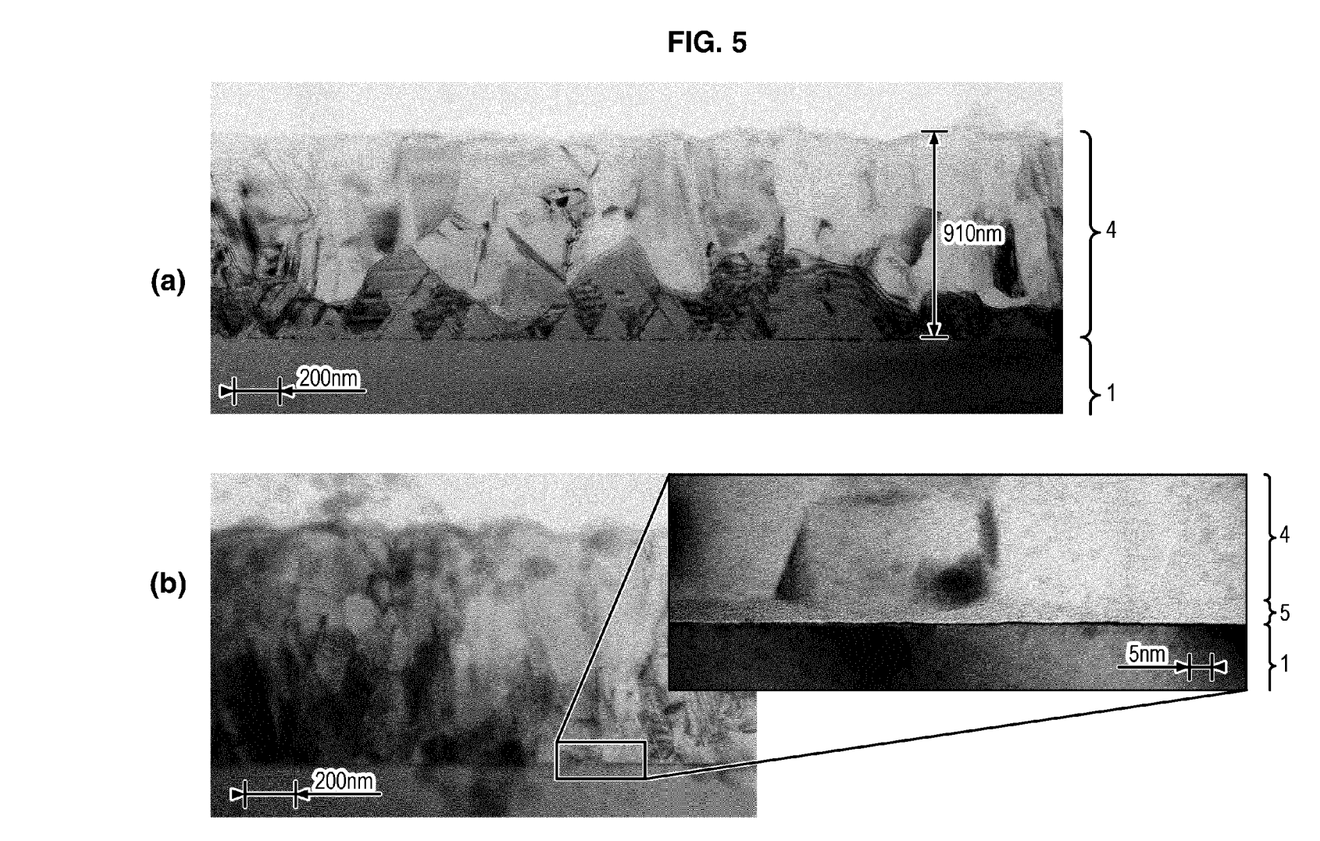
FIG. 5 shows photographs of the polycrystalline silicon layer of an HR-SOI substrate according to prior art (a) and an HR-SOI substrate conforming with the invention (b), taken with a transmission electron microscope.

As can be seen in FIG. 5 in which photograph (a) is an image of the interface between layer 4 and substrate 1 taken by a transmission electron microscope (TEM), about one third of the polycrystalline silicon has recrystallized starting from the interface with the substrate 1.

Another technique consists of diffusing gold through the entire HR silicon substrate.

For example, information on this subject can be found in the paper written by D. M. Jordan, Kanad Mallik, R. J. Falster, P. R. Wilshaw, "Semi-insulating silicon for microwave devices", Solid-state phenomena Vols 156-158 (2010) pp 101-106, in which the authors propose to introduce gold impurities into the silicon substrate by means of a gold deposit on the substrate followed by diffusion under the effect of a high temperature heat treatment. The effect of these gold impurities is to introduce deep levels in the forbidden band and block the Fermi level in the middle of the forbidden band, which generates a very high resistivity of the material.

However, it is essential to prevent gold from escaping from the substrate; gold is an element that very strongly shortens the life of silicon and contamination of the clean room and/or the thin silicon layer would seriously degrade the performances of devices manufactured in it.

Efficient diffusion barriers (for example nitride barriers) have to be provided to prevent gold from escaping, but this would be at the detriment of the performances of the devices. For example, nitride charges affect transistor threshold voltages.

Another relevant patent is U.S. Pat. No. 6,548,382 that on the contrary proposes to avoid the presence of impurities in the HR substrate by trapping them in a layer formed either by implantation of gaseous species or by implantation of particles that form precipitates insensitive to later heat treatments. The particles may consist of oxygen and/or other materials, excluding metals and semiconductors. These precipitates then form impurity trapping sites.

Document WO 2010/002515 discloses an alternative to the use of an HR silicon-based substrate in the HR-SOI substrates mentioned above, by replacing this bulk base substrate by a structure comprising a thick semiconducting layer with high resistivity on a support with standard resistivity.

To prevent the risk of doping agents or contaminants present in the support diffusing into this highly resistive semiconducting layer and thus reducing its resistivity, it is recommended that a diffusion barrier should be placed between the support and the semiconducting layer. Such a diffusion barrier may consist of one or several layers of silicon oxide and/or silicon nitride and has a thickness of at least 20 nm.

Moreover, this resistive layer can be considered like a substrate due to its high thickness (of the order of 50 to 100 µm).

Substrates for radiofrequency devices are affected by the electric field that, due to the high frequency, penetrates into the substrate and affects any charge carriers that it meets with the consequences firstly of useless energy consumption (called transmission loss), and secondly it can influence other devices whose behavior will be modified through the substrate (called the crosstalk phenomenon).

Moreover, increasing and decreasing the signal induces a variation in the capacitance of the substrate that causes the generation of waves at harmonic frequencies of the main frequency. These harmonic waves and combinations of them can form parasite signals particularly damaging for radiofrequency applications. The use of a polycrystalline silicon layer blocks the potential under the BOX, thus limiting capacitance variations and therefore reducing the power of the generated harmonic waves.

Finally, the presence of any charges in the BOX and the use of DC voltages by some devices can lead to the creation of an accumulation or inversion layer (therefore highly conducting) under the BOX. The polycrystalline silicon layer eliminates this negative effect by blocking the potential under the BOX.

Therefore, a first purpose of the invention is to define a method for manufacturing an HR-SOI type substrate with improved properties for radiofrequency applications.

Another purpose of the invention is to procure an HR-SOI type substrate in or on which components for radiofrequency devices with improved operating characteristics will be manufactured.

BRIEF DESCRIPTION OF THE INVENTION

The invention discloses a method for manufacturing a semiconductor on insulator type substrate for radiofrequency applications, comprising the following steps in sequence:
(a) provision of a silicon substrate with an electrical resistivity of more than 500 Ohm.cm,
(b) formation of a polycrystalline silicon layer on the substrate, the method being characterized in that it comprises a step between steps a) and b) to form a dielectric material layer, different from a native oxide layer, on the substrate, between 0.5 and 10 nm thick.

Advantageously, the method comprises the following steps in sequence after step (b):
(c) formation of a dielectric material layer on the polycrystalline silicon layer and/or on a semiconducting material layer of a donor substrate;
(d) bonding of the substrate obtained in step (c) on the donor substrate, the dielectric layer(s) formed in step (c) being at the interface;
(e) separation of the thin layer from the donor substrate.

The concentration of doping agents in the polycrystalline silicon layer is less than or equal to $10^{16}$ cm$^{-3}$, and preferably less than or equal to $10^{14}$ cm$^{-3}$.

Furthermore, the polycrystalline silicon layer is between 100 and 10000 nm thick, and preferably between 300 and 3000 nm.

According to one preferred embodiment of the invention, the dielectric material formed under the polycrystalline silicon layer is silicon oxide.

The invention also relates to a base substrate for the formation of a semiconductor on insulator type substrate comprising a silicon substrate with an electrical resistivity of more than 500 Ohm.cm and a polycrystalline silicon layer, characterized in that it comprises a dielectric material layer, different from a native oxide layer, between the substrate and the polycrystalline silicon layer, between 0.5 and 10 nm thick.

Another purpose of the invention is a semiconductor on insulator type substrate for radiofrequency applications, comprising a silicon substrate with an electrical resistivity of more than 500 Ohm.cm, followed successively by a polycrystalline silicon layer, a dielectric material layer, and a monocrystalline semiconducting material layer, characterized in that it comprises a dielectric material layer, different from a native oxide layer, between the substrate and the polycrystalline silicon layer, with a thickness less than or equal to 2 nm, and in that the electrical resistivity of the polycrystalline silicon layer is equal to at least that of the substrate.

The concentration of doping agents in the polycrystalline silicon layer is less than or equal to $10^{16}$ cm$^{-3}$, and is preferably less than or equal to $10^{14}$ cm$^{-3}$.

The thickness of the polycrystalline silicon layer is between 100 and 10000 nm, and preferably between 300 and 3000 nm.

Finally, the invention relates to a radio frequency device comprising components formed in or on the layer of semiconducting material in a semiconductor on insulator type substrate like that described above.

BRIEF DESCRIPTION OF THE DRAWINGS

Other characteristics and advantages of the invention will become clear after reading the following description with reference to the appended drawings on which.

DETAILED DESCRIPTION OF THE INVENTION

Figure 3:
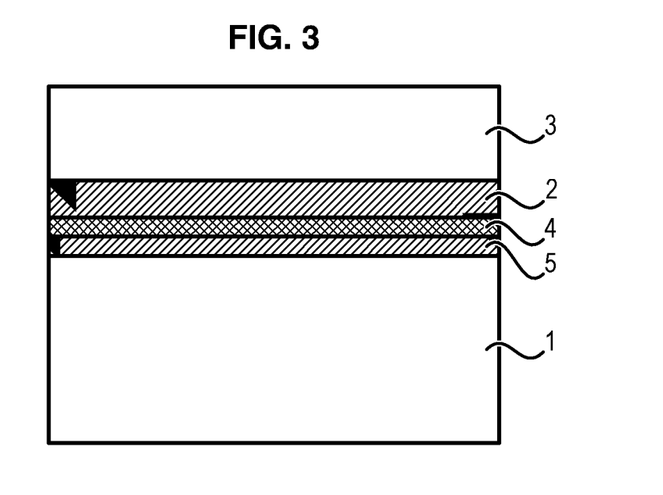
FIG. 3 is a diagram of an HR-SOI substrate conforming with the invention.

FIG. 3 shows an example of a semiconductor on insulator HR-SOI type substrate conforming with the invention.

Note that the thicknesses of the various layers are not all shown to the same scale, to make the figures more easily understandable.

This substrate is obtained from a base substrate (like that shown in FIG. 4B) comprising a high resistivity silicon substrate 1 followed successively by a layer 5 of dielectric material such as silicon oxide, and a polycrystalline silicon layer 4.

The thickness of the dielectric material layer 5 in this base substrate is between 0.5 and 10 nm, and preferably between 3 and 5 nm.

The detailed description given below generally refers to silicon oxide ($SiO_2$) as the preferred dielectric material, layer 5 then being referred to as the "oxide layer."

However, the invention is not limited to this material and it can be implemented using any other type of dielectric material such as silicon nitride or any dielectric with a low dielectric constant («low-k»).

The method for manufacturing this base substrate is described in detail below.

A semiconductor on insulator type substrate (HR-SeOI) is manufactured from this base substrate using any appropriate method.

With reference to FIG. 3, this HR-SeOI substrate comprises the high resistivity substrate 1 followed successively by the polycrystalline silicon layer 4 (of the base substrate), a dielectric material layer 2 also called a BOX, and a layer 3 of semiconducting material, for example silicon (in the case of an SOI substrate).

The SOI substrate may also include the oxide layer 5 between the high resistivity substrate 1 and the polycrystalline silicon layer 4, but the thickness of this oxide layer is less than the thickness of layer 5 in the base substrate.

As we will see later, the thickness of the oxide layer 5 in the base substrate reduces during formation of the SOI due to the applied heat treatments.

This oxide layer 5 is different from a native oxide layer due to its stœchiometry ($SiO_2$) and its density that is higher.

In this respect, it should be noted that a native oxide layer is neither thick enough, nor of good enough quality to ensure a significant delay in the recrystallization.

To the contrary, an oxide layer that is formed, e.g., by rapid thermal oxidation (RTO), dry thermal oxidation or a low temperature oxygen plasma treatment, has a stoichiometry that is close to $SiO_2$.

Due to its greater density, such an oxide layer is strong enough to withstand the thermal treatment and prevent or at least substantially delay the recrystallization.

Above a given thickness (which depends on the process used, thermal treatment and level of stress reached in the oxide), the oxide will be completely stable and will not break or disappear.

A suitable silicon oxide layer for preventing or at least delaying the recrystallization of the polysilicon layer has an absorbance peak measured by the FTIR-ATR method (acronym for Fourier Transform Infra-Red spectroscopy—Attenuated Total Reflection) at a wavenumber greater than 1220 $cm^{-1}$, preferably greater than 1230 $cm^{-1}$ and even more preferably greater than 1240 $cm^{-1}$.

For example, for a thermal silicon oxide, the absorbance peak corresponds to a wavenumber of about 1245 $cm^{-1}$.

By contrast, for a native silicon oxide, the absorbance peak corresponds to a wavenumber of about 1210 $cm^{-1}$.

For further details about the FTIR-ATR method, reference can be made to chapter 4 of the dissertation by Kermit S. Kwan, "The Role of Penetrant Structure on the Transport and Mechanical Properties of a Thermoset Adhesive", Virginia Polytechnic Institute and State University, 1998.

The substrate 1 is a high resistivity silicon substrate.

For the purpose of this description, "high resistivity" means an effective electrical resistivity of more than 500 Ohm.cm, preferably more than 1000 Ohm.cm and even more preferably more than 3000 Ohm.cm, the effective electrical resistivity being the resistivity of a homogenous resistive element in an equivalent electrical circuit.

Layer 4 has a polycrystalline structure, in other words it is composed of different regions with different crystalline orientations and possibly amorphous zones.

When layer 4 comprises amorphous zones, these zones crystallize during heat treatments applied later on the substrate.

Layer 4 could be deposited in the form of amorphous silicon that becomes polycrystalline during later heat treatments.

Layer 4 is advantageously produced by MOCVD (Metal Organic Chemical Vapor Deposition).

Layer 4 preferably has a very low concentration of doping agents, in other words the concentration is less than or equal to $10^{16}$ $cm^{-3}$, preferably less than or equal to $10^{14}$ $cm^{-3}$ and even more preferably less than $10^{12}$ $cm^{-3}$.

It has been shown in the above-mentioned publications by D. Lederer and D. C. Kerr that defects present at the grain boundaries of polycrystalline silicon would significantly improve the performance of radio frequency devices formed on such an SOI substrate.

Layer 3 is a layer made of any semiconducting material from which the required devices can be made.

This layer 3 is preferably a monocrystalline silicon layer, but it may also be composed of germanium or SiGe, or a type III-V or II-VI alloy, etc.

It is said to be the useful layer because this is the layer in or on which devices are manufactured.

The silicon dioxide layer 5 between substrate 1 and the SOI polycrystalline silicon layer 4 is typically less than 2 nm thick.

Therefore, it is sufficiently thin to be transparent to free carriers so that it does not prevent the polycrystalline silicon layer 4 from performing its role, which consists of trapping carriers that circulate in the subjacent substrate 1.

It should be noted that layer 5 is not necessarily continuous; it might have been broken under the effect of high mechanical stresses applied to it during heat treatments applied during manufacturing of the SOI and devices formed in or on the SOI.

We will now describe a method for manufacturing the HR-SOI substrate with reference to FIGS. 4A to 4D.

Figure 4A:
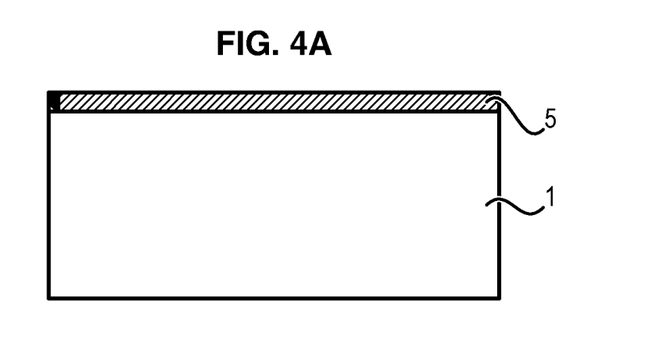
FIGS. 4A to D diagrammatically show steps in the method of manufacturing the HR-SOI substrate conforming with the invention.
Figure 4B:
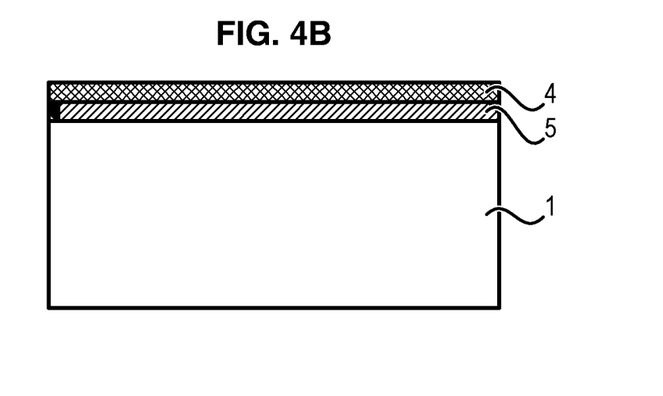

FIGS. 4A and 4B show steps in the formation of the base substrate 1, 5, 4.

As shown in FIG. 4A, the dielectric layer 5, for example made of $SiO_2$, is formed on the high resistivity substrate 1.

The thickness of this oxide layer will reduce during later heat treatments.

Layer 5 is formed so that after the SOI or the final radiofrequency device has been made, the residual thickness of layer 5 is zero or sufficiently small so that it does not act as an obstacle to the passage of carriers from substrate 1 to the polycrystalline silicon layer 4 (i.e. less than or equal to about 2 nm).

However, the initial thickness of layer 5 must be sufficient to prevent the polycrystalline silicon layer 4 from recrystallizing during heat treatments applied to make the SOI or the final radiofrequency device, or at least to strongly delay this recrystallization.

Considering these constraints, a judicious choice consists of forming the dielectric layer 5 with a thickness of between 0.5 and 10 nm and preferably between 3 and 5 nm, the choice of the thickness being made as a function of the thermal budget (temperature, duration) to be applied to the base substrate until the final device is achieved.

Thus, it has been verified that a thickness of 3.5 nm of $SiO_2$ prevents recrystallization of polycrystalline silicon during a subsequent heat treatment at 1100° C. for several hours, which is a typical thermal budget applied during formation of the semiconductor on insulator substrate, and then when making radiofrequency devices in or on the useful layer.

Layer 5 also performs a trapping function, to trap undesirable doping agents present on the surface of substrate 1 during its formation.

With reference to FIG. 4B, the polycrystalline or amorphous silicon layer 4 is made to grow on layer 5.

Those skilled in the art are familiar with techniques that can be used to deposit such a layer in polycrystalline or amorphous form.

The thickness of layer 4 is between 100 and 10000 nm, and preferably between 300 and 3000 nm.

Therefore the substrate thus obtained forms a base substrate for implementation of a method of making a semiconductor on insulator type substrate using steps described below.

Figure 4C:
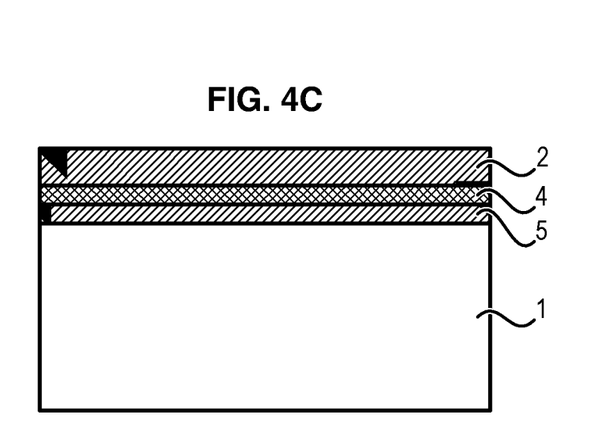

With reference to FIG. 4C, a dielectric material layer 2 that will eventually form all or part of the BOX is formed on layer 4 of the base substrate.

According to one particular embodiment, the layer 2 alone forms the BOX.

Alternately (not shown), a dielectric material layer can be formed on the base substrate layer 4 and also on the donor substrate face that will be bonded to the base substrate to transfer the thin layer 3, the sum of the thicknesses of the dielectric layers being equal to the required thickness of the BOX 2.

According to another variant (not shown), the layer that will form the BOX is entirely formed on the donor substrate face that will be bonded to the base substrate.

The material used for layer 2 may be silicon oxide, or particularly advantageously a low-K dielectric material.

Figure 4D:
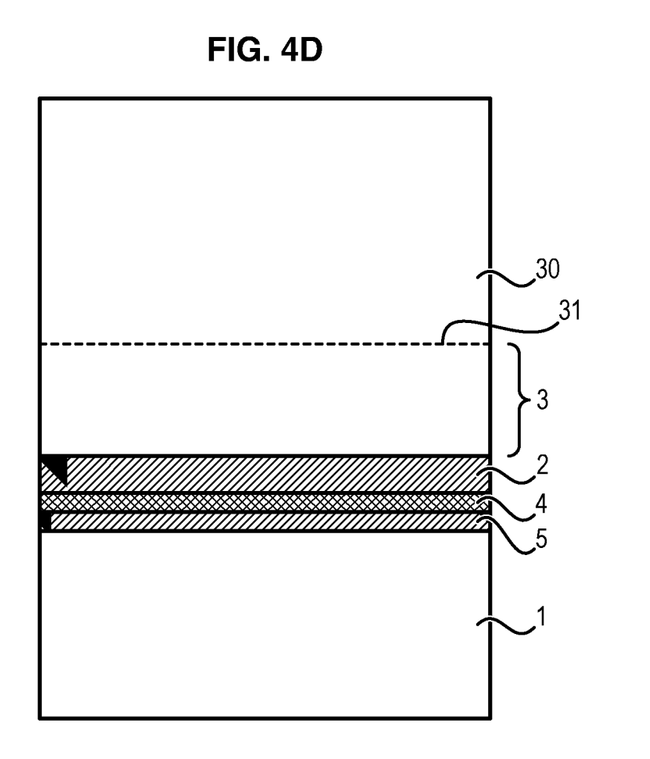

With reference to FIG. 4D, a donor substrate 30 comprising the layer that will become the useful layer 3, is bonded onto the structure thus formed.

Those skilled in the art will be capable of choosing an appropriate technique among all known techniques.

For example, as shown herein, a SMARTCUT® type process can be used that involves forming a weakening zone 31 that delimits layer 3 in the donor substrate 30 before bonding.

Layer 3 is then separated from the donor substrate 30.

Once a weakening zone has been created, cleavage along this zone can be initiated by applying mechanical and/or thermal and/or chemical forces.

Alternatively, the donor substrate 30 can be thinned from the back by the « Bonded and Etched-Back Silicon-On-Insulator » (BESO™) method.

After optional polishing/planarization steps, the substrate shown in FIG. 3 is achieved.

A radio frequency device can then be formed in or on layer 3 of this SOI by any method known to those skilled in the art.

Since the process for making this device also involves high temperature heat treatments, the thickness of the oxide layer 5 located under polycrystalline silicon layer 4 may be further reduced or the layer can possibly be eliminated.

However, throughout this process, the oxide layer 5 will have prevented or strongly delayed recrystallization of the polycrystalline silicon and therefore kept the polycrystalline structure and consequently high resistivity of the layer 4.

If the oxide layer 5 is sufficiently thin (typically less than 0.8 nm), it could have been eliminated after the heat treatments.

If the oxide layer 5 is thicker, its thickness may be reduced by a few angstroms without causing elimination of the layer.

However, heat treatments applied to the substrate generate very strong mechanical stresses in layer 5, which tend to break the layer and make it discontinuous.

Furthermore, dissolution of the oxide apparently occurs at grain boundaries, made possible by an oxygen concentration in the polycrystalline silicon layer 4 less than the solubility of oxygen in this layer.

Furthermore, even if a residual thickness of oxide does remain under the polycrystalline silicon layer 4, it is thin enough so that it does not make the oxide layer insulating.

Consequently, despite this possible residual oxide layer, the polycrystalline silicon layer 4 is capable of trapping free carriers that circulate in substrate 1, particularly if it is discontinuous.

Curve (b) in the graph in FIG. 2 (in solid lines) shows the variation of electrical resistivity ρ in the substrate of FIG. 4B as a function of the depth d after a heat treatment at 1100° C. for 6 hours, simulating the thermal budget for production of the HR-SOI substrate.

Therefore as mentioned above, the abscissa d=0 corresponds to the upper surface of the polycrystalline silicon layer, in other words the interface between the BOX 2 and the polycrystalline silicon layer 4.

The thickness of the oxide layer 5 has been exaggerated on this graph for illustration purposes; this thickness is actually of the order of a few nanometers.

As can be seen on curve (b), the resistivity of the polycrystalline silicon layer remains approximately constant starting from the interface with the BOX while being greater than the maximum resistivity observed in the polycrystalline silicon in the substrate according to prior art (the notch-shaped increase observed close to the subjacent oxide layer 5 is an artifact of the SRP measurement).

The resistivity drops suddenly at the interface between the oxide layer 5 and the substrate 1, but nevertheless, it reaches a minimum value at the interface with substrate 1 which is much greater than the value obtained with the substrate according to prior art.

The minimum resistivity observed in substrate 1 of HR silicon is of the order of 80 Ohm.cm, which is about two orders of magnitude more than in prior art.

The fact that the resistivity in layer 4 remains high is due to the fact that the polycrystalline silicon did not recrystallize during the above-mentioned heat treatment, unlike the case in prior art.

This conservation of the polycrystalline structure can be seen on photograph (b) in FIG. 5, which presents an image of the interface between layers 4 and 5 and substrate 1 of the substrate in FIG. 3, taken with a transmission electron microscope.

This result is essentially due to the presence of the oxide layer 5 which prevented recrystallization of the polycrystalline silicon due to its amorphous structure.

Furthermore, the fact that the minimum resistivity value obtained in the HR silicon substrate is significantly greater than that obtained with a substrate according to prior art can be explained by the fact that the oxide layer 5 trapped at least part of the contaminants that were present on the surface of substrate 1.

Figure 6:
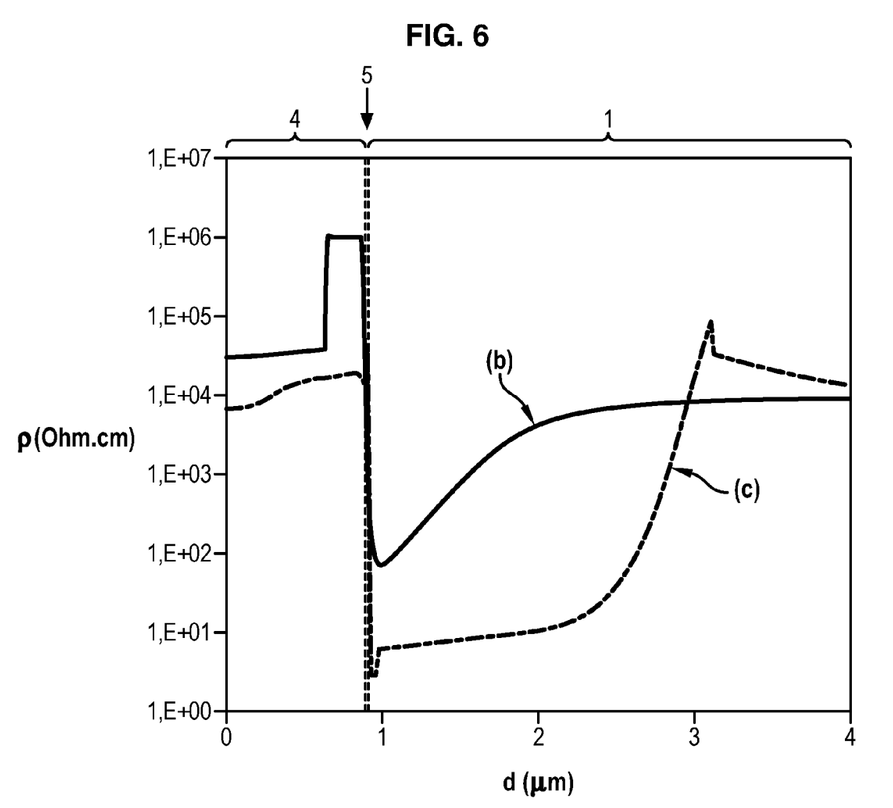
FIG. 6 is a graph showing the variation in electrical resistivity as a function of the depth in the substrate, for a substrate conforming with the invention in which the dielectric layer located under the polycrystalline silicon layer is a silicon oxide layer (b) and for a similar substrate but with a silicon nitride layer (c) instead of the oxide layer.

This particular effect of silicon oxide is demonstrated on the graph in FIG. 6, which shows the variation of resistivity in a base substrate conforming with the invention, in other words comprising an HR silicon substrate 1 followed successively by an $SiO_2$ layer 5, and a polycrystalline silicon layer 4 (curve (b) in solid lines) and in a substrate similar to the previous substrate, but in which the $SiO_2$ layer 5 has been replaced by a layer of another dielectric material, here silicon nitride (curve (c) in dashed lines).

The origin of the abscissa axis (d=0) corresponds to the upper surface of the polycrystalline silicon layer 4.

A heat treatment at 1100° C. was applied to these two substrates for 6 hours, and these substrates comprise a layer 5 (made of $SiO_2$ and $Si_3N_4$ respectively) of the order of 3.5 nm thick after application of the thermal budget.

It is seen that like the $SiO_2$ layer, the silicon nitride layer 5 acted to block recrystallization, as can be seen by the fact that the resistivity of the polycrystalline silicon remains high, unlike the case in prior art.

Figure 7:
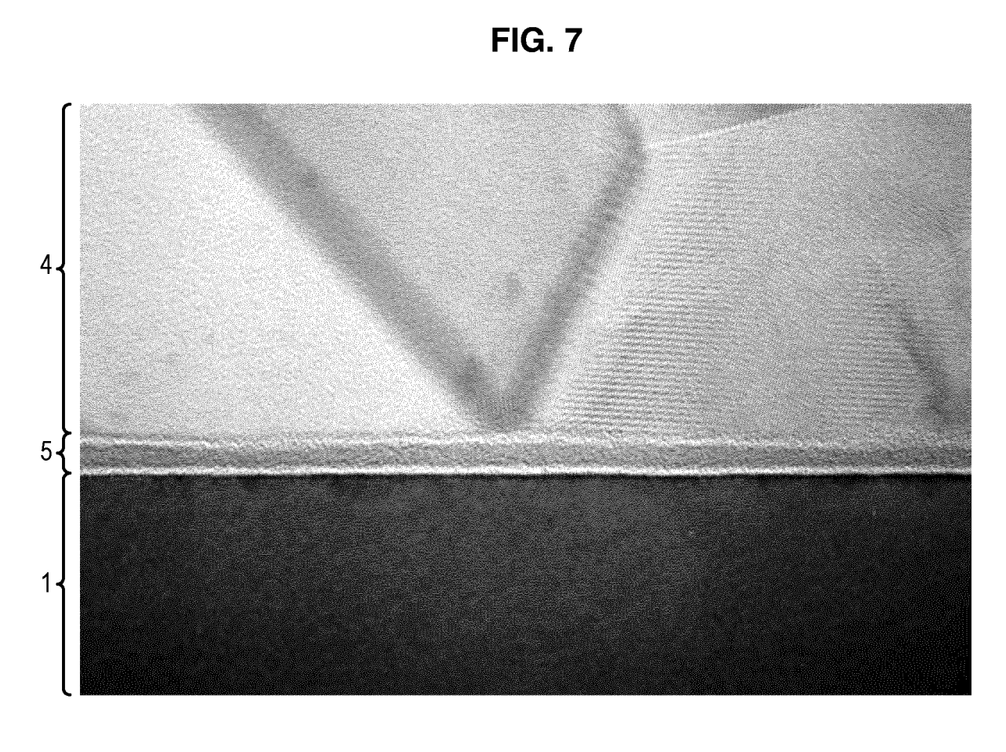
FIG. 7 is a photograph of the polycrystalline silicon layer of an HR-SOI substrate conforming with the invention in which the dielectric layer is a silicon nitride layer, taken with a transmission electron microscope.

The lack of recrystallization of the polycrystalline silicon layer can also be seen in FIG. 7, which is a photograph taken using a transmission electron microscope of the interface between layers 4 and 5 and substrate 1 of the substrate in FIG. 3, on which different grains of silicon can be seen in layer 5.

Although the silicon nitride layer in the example presented herein had practically no effect (compared with prior art) on the resistivity of the HR silicon substrate 1 close to the interface, this could be corrected by eliminating all contamination at the surface of substrate 1 before deposition of the silicon nitride layer.

Example Embodiment of the Invention

A first step consists of applying special cleaning of the high resistivity silicon substrate.

The purpose of this cleaning is to minimize the quantity of doping agents (mainly boron and phosphorus atoms) at the substrate surface.

An appropriate cleaning method may for example include cleaning with hydrofluoric acid (HF) diluted to 0.2% to remove the chemical oxide, followed successively by cleaning with ozone and then hydrochloric acid (HCl) to form a thin layer of oxide (in other words with a thickness of about 0.7 to 0.8 nm). This cycle can be repeated twice to increase consumption of the silicon surface on which undesirable contaminants are located.

The next step is to form a thin layer of oxide (about 0.5 to 10 nm) on the surface of the high resistivity silicon substrate.

Adapted techniques include a standard thermal oxidation treatment known to those skilled in the art as « Rapid Thermal Oxidation » (RTO), dry thermal oxidation or a low temperature oxygen plasma treatment.

It is important to restrict the exposure time of the substrate to ambient air in the clean room in order to prevent condensation of undesirable doping agents on the surface.

A layer of undoped polycrystalline silicon can be grown on the previously formed thin oxide layer.

This can be done using a conventional Low Pressure Chemical Vapor Deposition (LPCVD) method or a Metal Oxide Chemical Vapor Deposition (MOCVD).

For example, the thickness of the polycrystalline silicon layer is about 1 μm and it has the lowest possible concentration of doping agents, in other words not more than of the order of $10^{14}$ $cm^{-3}$, and preferably less than $10^{12}$ $cm^{-3}$.

Optionally, an oxide deposition or oxidation step, or a heat treatment or planarization step can be carried out in order to prepare the surface of the structure thus obtained for bonding with a donor substrate comprising the thin silicon layer that will become the useful layer.

The SeOI substrate is then made using any method known to those skilled in the art, and the previously formed structure will form the receiving substrate or base substrate. Advantageously, a SMARTCUT® method is used.

Obviously, the examples that have been given above are simply particular illustrations and are in no way limitative to the scope of the invention.

The invention claimed is:

1. A method for manufacturing a semiconductor on insulator type substrate, comprising the following steps in sequence:
    (a) providing a silicon substrate with an electrical resistivity of more than 500 Ohm.cm,
    (b) forming a dielectric material layer different from a native oxide layer on the silicon substrate, the thickness of the dielectric material layer being between 0.5 and 10 nm,
    (c) forming a polycrystalline silicon layer on the silicon substrate, and
    (d) subjecting the silicon substrate, the dielectric material layer and the polycrystalline silicon layer to a heat treatment wherein the dielectric material layer is at least partially dissolved during the heat treatment.

2. The method of claim 1, further comprising the following steps in sequence after step (c):
    (c1) forming a dielectric material layer on the polycrystalline silicon layer and/or on a semiconducting material layer of a donor substrate, (c2) bonding the substrate obtained in step (c) on the donor substrate, the dielectric layer(s) formed in step (c1) being at the interface, (c3) separating the semiconducting material layer from the donor substrate.

3. The method of claim 1, wherein a concentration of doping agents in the polycrystalline silicon layer is less than or equal to $10^{16}$ cm$^{-3}$, and preferably less than or equal to $10^{14}$ cm$^{-3}$.

4. The method of claim 1, wherein the polycrystalline silicon layer is between 100 and 10000 nm thick, and preferably between 300 and 3000 nm.

5. The method of claim 1, wherein the dielectric material layer formed between the substrate and the polycrystalline silicon layer is silicon oxide.

* * * * *